United States Patent
Yip

(10) Patent No.: US 8,947,934 B2
(45) Date of Patent: Feb. 3, 2015

(54) SHARING LOCAL CONTROL LINES ACROSS MULTIPLE PLANES IN A MEMORY DEVICE

(75) Inventor: Aaron Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 411 days.

(21) Appl. No.: 13/339,721

(22) Filed: Dec. 29, 2011

(65) Prior Publication Data

US 2013/0170299 A1    Jul. 4, 2013

(51) Int. Cl.
*G11C 16/04* (2006.01)
*G11C 16/06* (2006.01)
*G11C 8/00* (2006.01)
*G11C 8/12* (2006.01)
*G11C 7/10* (2006.01)

(52) U.S. Cl.
CPC ...... *G11C 16/04* (2013.01); *G11C 8/00* (2013.01); *G11C 8/12* (2013.01); *G11C 16/06* (2013.01); *G11C 7/10* (2013.01)
USPC ............ 365/185.13; 365/185.11; 365/185.12; 365/185.17

(58) Field of Classification Search
CPC .......... G11C 16/04; G11C 16/06; G11C 8/00; G11C 8/12; G11C 7/10
USPC ............. 365/185.13, 185.11, 185.12, 185.17
See application file for complete search history.

(56) References Cited

U.S. PATENT DOCUMENTS

| | | | |
|---|---|---|---|
| 7,142,453 B2 | 11/2006 | Futatsuyama | |
| 7,382,651 B2 | 6/2008 | Nagao et al. | |
| 8,125,829 B2 * | 2/2012 | Tanzawa | 365/185.13 |
| 8,208,306 B2 * | 6/2012 | Pyeon et al. | 365/185.17 |
| 8,432,739 B2 * | 4/2013 | Park | 365/185.13 |
| 8,542,534 B2 * | 9/2013 | Yamada et al. | 365/185.19 |
| 2009/0097316 A1 * | 4/2009 | Lee | 365/185.13 |
| 2009/0244982 A1 * | 10/2009 | Han et al. | 365/185.23 |
| 2011/0019477 A1 | 1/2011 | Hashimoto et al. | |

* cited by examiner

*Primary Examiner* — Toan Le
(74) *Attorney, Agent, or Firm* — Dicke, Billig & Czaja, PLLC

(57) ABSTRACT

Memory devices, methods for accessing a memory cell, and memory systems are disclosed. One such memory device includes a plurality of planes of memory cells. Each plane of memory cells includes series strings of memory cells that each have a select gate drain transistor. Control gates of corresponding select gates are coupled together by a shared local control line. Each of a plurality of global control lines are coupled to their corresponding local control line with only a single global select gate.

31 Claims, 7 Drawing Sheets

SHARING LOCAL CONTROL LINES ACROSS MULTIPLE PLANES IN A MEMORY DEVICE

TECHNICAL FIELD

The present embodiments relate generally to memory and a particular embodiment relates to sharing local control lines in a memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A flash memory device is a type of memory in which the cells are typically grouped into blocks that can be erased and reprogrammed in blocks instead of one byte at a time. Changes in threshold voltage of the memory cells, through erasing or programming of charge storage structures (e.g., floating gates or charge traps) or other physical phenomena (e.g., phase change or polarization), determine the data value of each cell. The data in a cell of this type is determined by the presence or absence of the charge in the charge storage structure.

The memory array of a flash memory device is typically connected in one of many different architectures. For example, two of the more common architectures are the NOR and NAND architectures.

NOR and NAND flash memory get their names from the structure of the interconnections between memory cells. In NOR flash memory, cells are connected in parallel to the bit lines thus allowing cells to be read and programmed individually. The parallel connection of cells resembles the parallel connection of transistors in a CMOS NOR gate. In NAND flash memory, cells are connected in series strings that each resembles a NAND gate. The series connections consume less space than parallel memory. This can reduce the cost of NAND flash memory as compared to NOR flash memory.

One technique used to increase the memory density of a NAND memory device is to form the memory array in a three dimensional (3D) manner. In other words, instead of the series memory strings being formed horizontally on a memory die, the series strings are formed vertically. FIG. 1 illustrates one example of such a 3D NAND memory.

FIG. 1 illustrates perspective view of a memory block in a typical prior art 3D NAND memory array. The memory block comprises two planes 110, 111 that each comprise a plurality of series strings of memory cells 101 that are formed vertically in a die. The pitch that the vertical memory strings of the block fit into is typically only a few microns.

For a given plane 110, 111 of the block, a different local word line LWL<31:0> is coupled to control gates of each row 102 of memory cells. FIG. 1 shows that the plurality of local word lines LWL<31:0> are formed vertically one above the other. The local word lines LWL<31:0> are eventually coupled to global word lines, as shown in FIG. 2.

The series strings 101 are each coupled through a respective select gate 113 to a common bit line BL. The control gates of the plurality of select gates are coupled to common local select gate drain lines LSGD<15:0>. The local select gate drain lines are eventually coupled to global select gate drain lines, as shown in FIG. 2.

FIG. 2 illustrates a schematic diagram of sixteen planes of memory cells that employ a typical prior art architecture for coupling the local select gate drain lines and local word lines of the planes to their respective global lines. Two memory blocks M 201 and M+1 202 and 16 planes 210-213 are illustrated.

Each plane 210-213 has its own independent set of global word lines (GWL) and global select gate drain lines (GSGD). These lines are designated as GWL<31:0> and GSGD<15:0>, respectively.

Each plane also has its own dependent set of local select gates 220-223 (e.g., transistors) to drive the local word lines and local select gate drain lines, as shown in FIG. 2. Thus, in the illustrated embodiment, a total of 48 select gates 220-223 need to be routed for each plane 210-213 of each block 201, 202 and within the pitch of just a few microns. This can result in a reduced die yield due to the routing of such a large number of transistors in a relatively small space.

For the reasons stated above, and for other reasons stated below that will become apparent to those skilled in the art upon reading and understanding the present specification, there is a need in the art for a memory array architecture that can fit into relatively small pitches.

DETAILED DESCRIPTION

Figure 1:
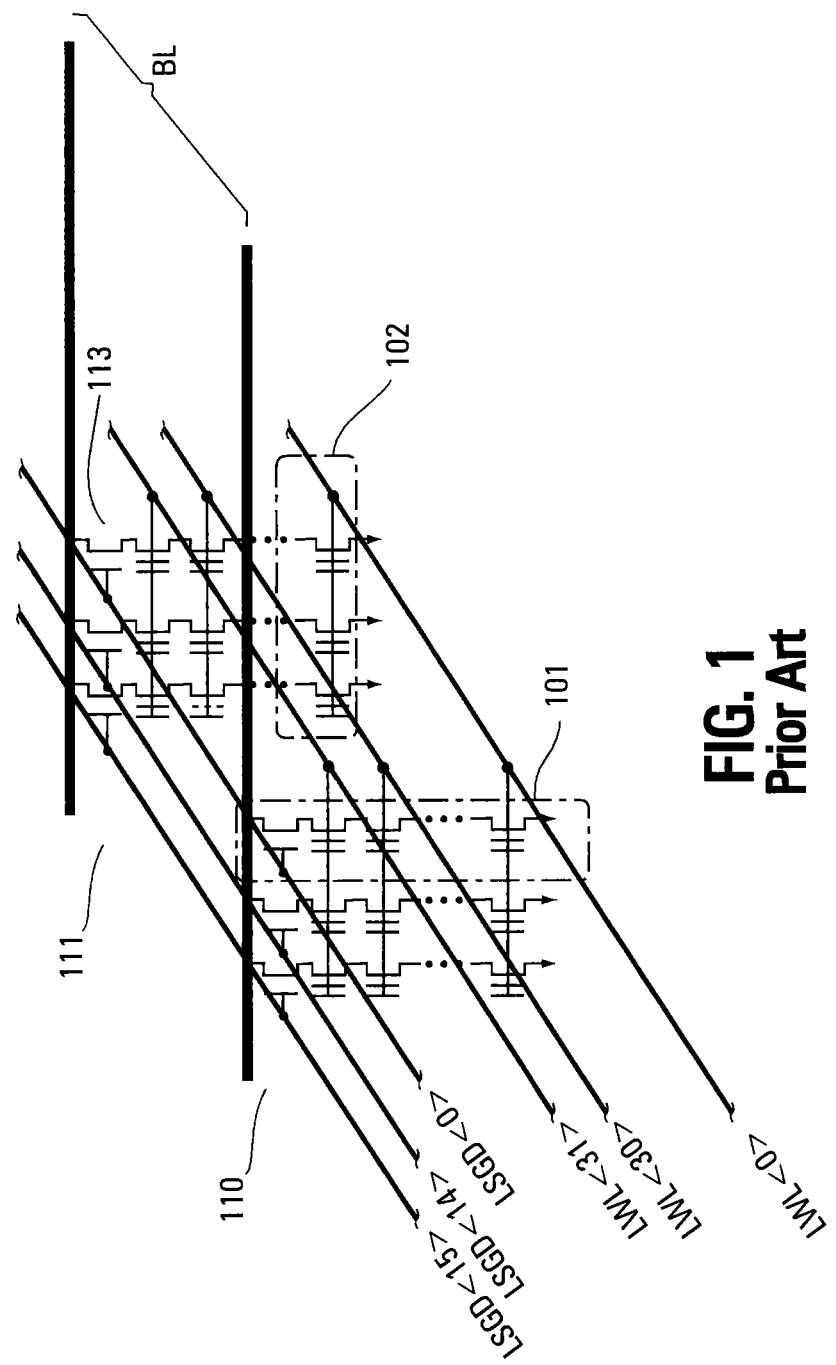
FIG. 1 shows a perspective view of a memory block in a typical prior art three dimensional memory array.
Figure 2:
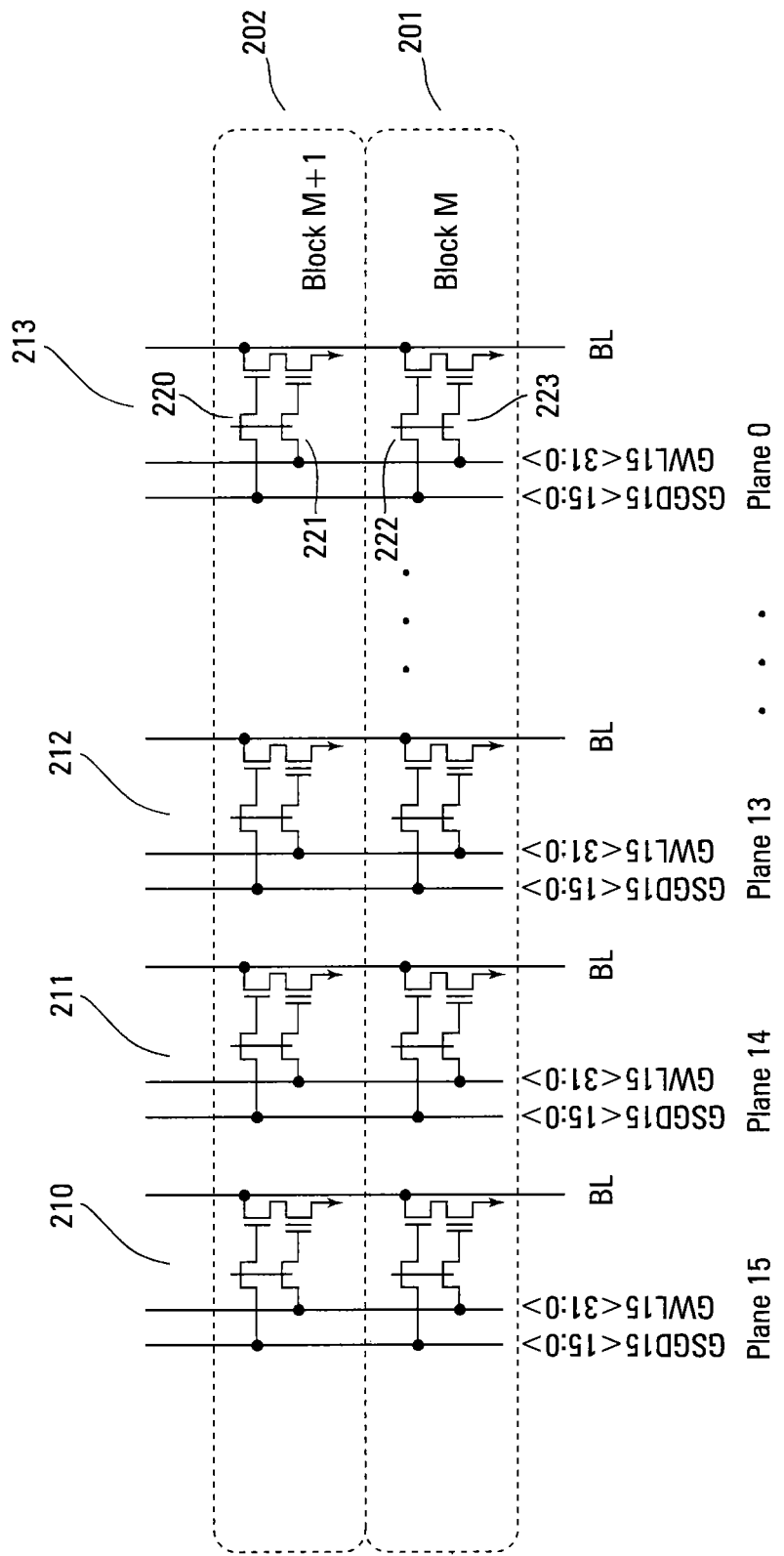
FIG. 2 shows a schematic diagram of a typical prior art memory architecture comprising a plurality of planes of memory cells.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 3:
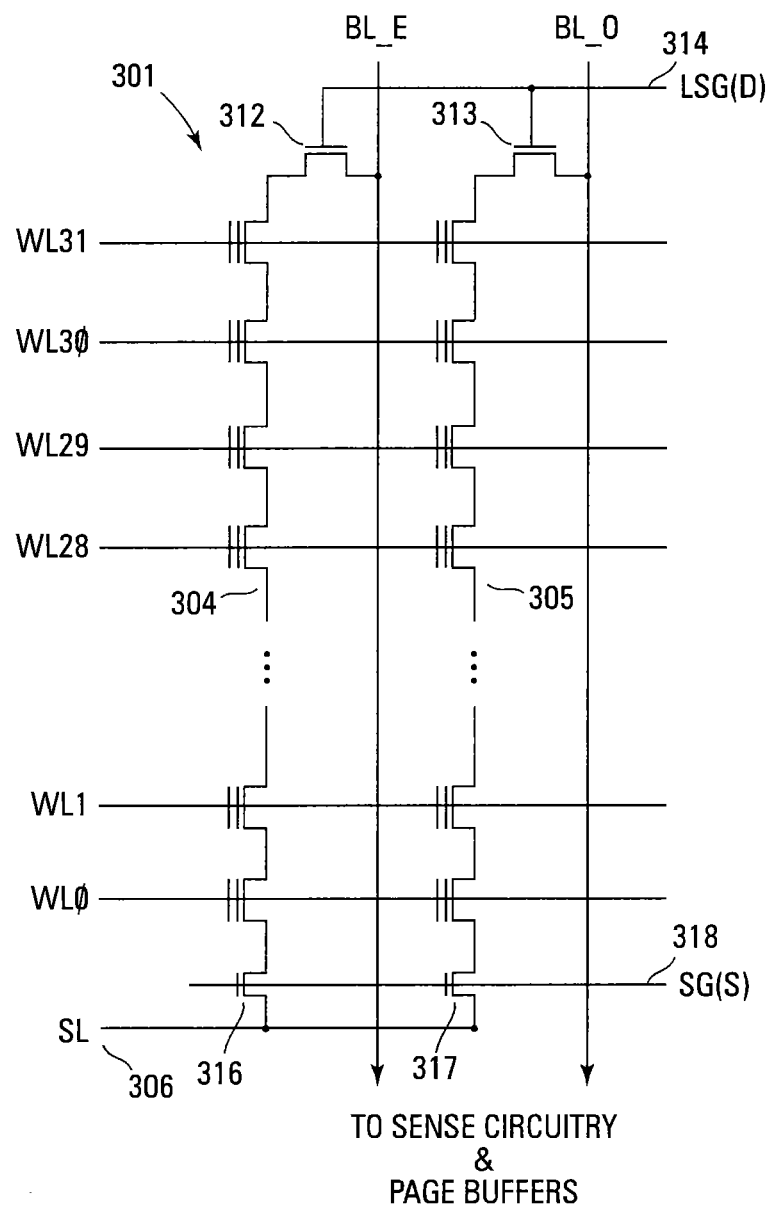
FIG. 3 shows a schematic diagram of one embodiment of a portion of a NAND architecture memory array.

FIG. 3 illustrates a schematic diagram of one embodiment of a portion of a NAND architecture memory array 301. The present embodiments are not limited to the illustrated NAND architecture. Alternate embodiments can use NOR or other architectures as well.

The array comprises an array of non-volatile memory cells 301 (e.g., floating gate) arranged in columns such as series strings 304, 305. Each of the cells are coupled drain to source in each series string 304, 305. A local access line (e.g. local word line) WL0-WL31 that spans across multiple series strings 304, 305 is coupled to the control gates of each memory cell in a row in order to bias the control gates of the memory cells in the row. Data lines, such as even/odd bit lines BL_E, BL_O, are coupled to the series strings and eventually coupled to page buffers and sense circuitry that detect the state of each cell by sensing current or voltage on a selected bit line.

Each series string 304, 305 of memory cells is coupled to a source line 306 by a source select gate 316, 317 and to an individual bit line BL_E, BL_O by a drain select gate 312, 313. The source select gates 316, 317 are controlled by a source select gate control line SG(S) 318 coupled to their control gates. The drain select gates 312, 313 are controlled by a local drain select gate control line LSG(D) 314.

Each memory cell can be programmed as a single level cell (SLC) or a multiple level cell (MLC). Each cell's threshold voltage ($V_t$) is indicative of the data that is stored in the cell. For example, in an SLC, a $V_t$ of 1.5V might indicate a programmed cell while a $V_t$ of –0.5V might indicate an erased cell. The MLC uses multiple $V_t$ ranges that each indicates a different state. Multilevel cells can take advantage of the analog nature of a traditional flash cell by assigning a bit pattern to a specific $V_t$ range. This technology permits the storage of data values representing two or more bits per cell, depending on the quantity of $V_t$ ranges assigned to the cell.

Figure 4:
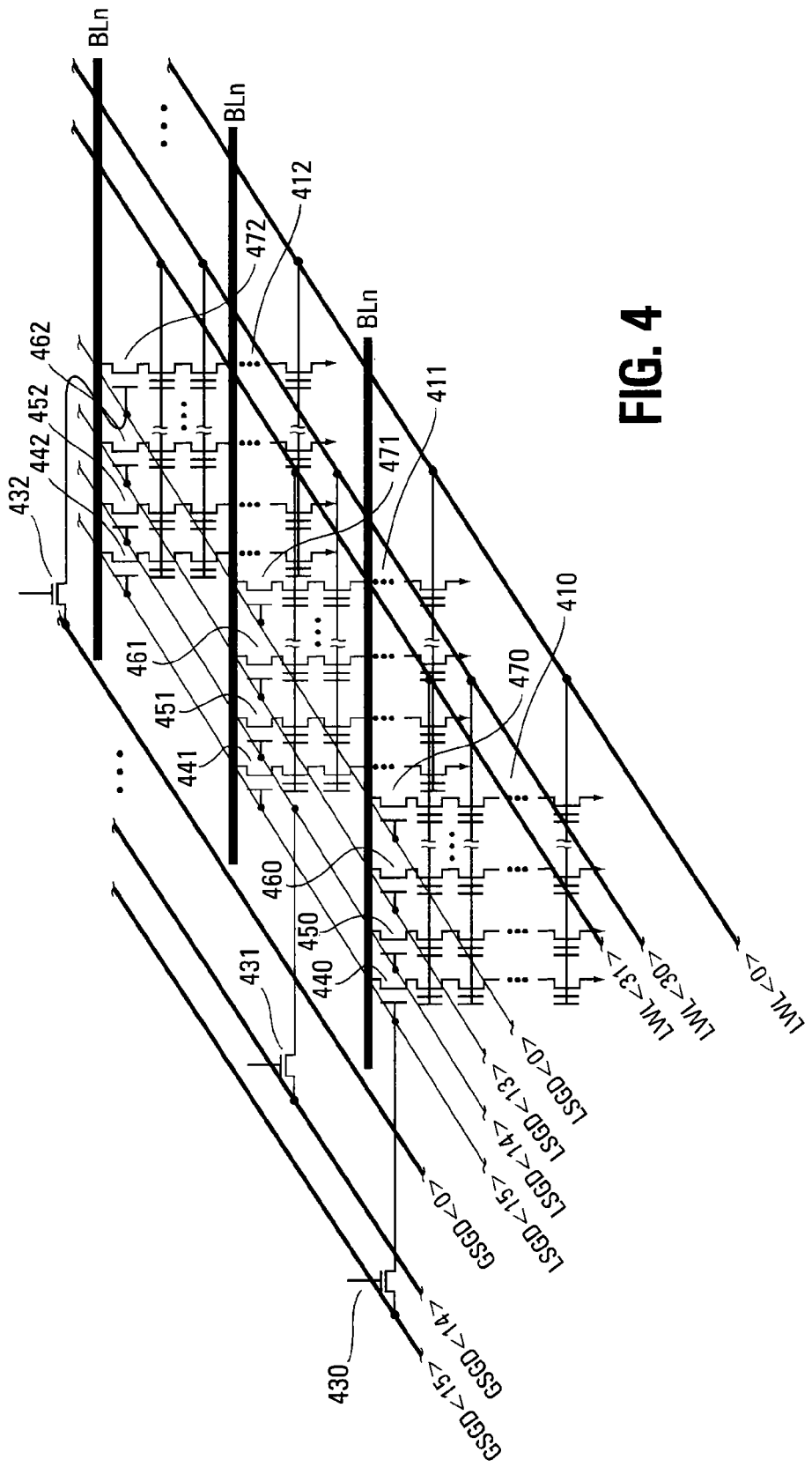
FIG. 4 shows a schematic diagram of one embodiment of an architecture in which local select gate drain lines are shared across multiple planes.

FIG. 4 illustrates a schematic diagram of one embodiment of an architecture in which local select gate drain lines are shared across multiple planes with only a single, global select gate driving a plurality of planes. Only one block of memory cells is illustrated for purposes of clarity. However, one skilled in the art would realize that the present disclosure encompasses any number of blocks.

The illustrated memory block comprises sixteen planes of which three planes 410-412 are shown. The planes can be formed vertically in a memory die. Each vertical plane 410-412 comprises sixteen vertical series strings of memory cells. Each vertical string of memory cells comprises a different select gate drain (e.g., transistor) SGD 440-442, 450-452, 460-462, 470-472 that couples its respective series string of memory cells to a bit line BLn. The number of vertical planes and vertical series strings shown is for purposes of clarity only as the present disclosure is not limited to any certain number of vertical planes or the number of vertical series strings in each plane.

Control gates of memory cells of a particular row of each plane 410-412 is coupled to a different local word line LWL. In the illustrated embodiment, there are 32 local word lines LWL<31:0>. For example, the top row of each plane 410-412 might be coupled to LWL<31> and the bottom row of each plane might be coupled to LWL<0>. Each local word line LWL<31:0> is coupled to its respective global word line GWL<31:0> (not shown). The number of rows in each vertical plane is for purposes of illustration as the present disclosure is not limited to any certain number of rows.

The control gate of the select gate drain for each particular series string of memory cells is coupled to its respective local select gate drain control line LSGD that is shared amongst the different planes. Thus, the control gate for a select gate drain for one plane is coupled to the control gates of the corresponding select gate drains for each of the other planes in the illustrated block of memory cells. For example, as illustrated in FIG. 4, SGD<15> 440-442 for the sixteenth series string of memory cells in each plane 410-412 is coupled to LSGD<15>. SGD<14> 450-452 for the fifteenth series string of memory cells in each plane 410-412 is coupled to LSGD<14>. SGD<13> 460-462 for the fourteenth series string of memory cells in each plane 410-412 is coupled to LSGD<13>. This continues for each of the series strings of memory cells in each plane of the illustrated block down to the first series string of memory cells in each plane 410-412 that is coupled to LSGD<0> 470-472.

Instead of using a plurality of select gates in each plane to couple the global select gate drain lines to the local select gate drain lines, as is done in the prior art, only a single select gate (e.g., drive transistor) is used to couple a global select gate drain GSGD line to each shared LSGD line. For example, the GSGD<15> line is coupled to the LSGD<15> line through select gate 430. The GSGD<14> line is coupled to the LSGD<14> line through the select gate 431. This continues for each of the global and local select gate drain lines down to the first global and local select gate drain line where the GSGD<0> line is coupled to the LSGD<0> line through select gate 432. Using the above-described architecture, the local SGD lines are shared across the plurality of planes of the memory block.

Figure 7:
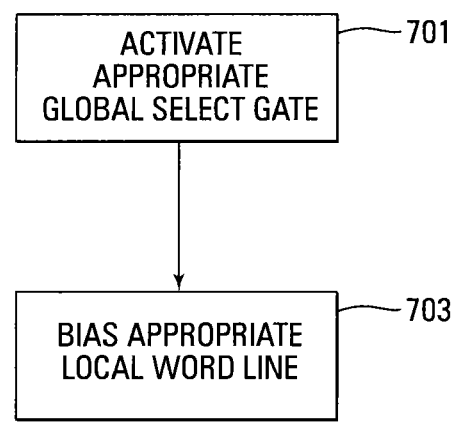
FIG. 7 shows a flowchart of one embodiment of a method for accessing a memory cell in accordance with the embodiments of FIGS. 4 and 5.

One embodiment of a method for accessing a memory cell is illustrated in the flowchart of FIG. 7. A respective one of the select gates between GSGD<15:0> lines and their respective local SGD lines LSGD<15:0> are enabled 701 by activation of the appropriate GSGD select gate when a particular sub-block (e.g., series string of memory cells) is to be accessed (e.g., write, read, erase). For example, if it is desired to access the sixteenth series string of memory cells of the sixteenth vertical plane 410, the appropriate select gate 430 activates the select gate drain transistors 440-442 of all of the vertical planes. The addressing and biasing of the appropriate local word lines LWL<31:0> 703 then determines which series string and which memory cell or cells of that particular series string is then accessed. A bit line coupled to the memory cell or cells to be accessed can also be biased with a voltage appropriate to the operation being performed.

Figure 5:
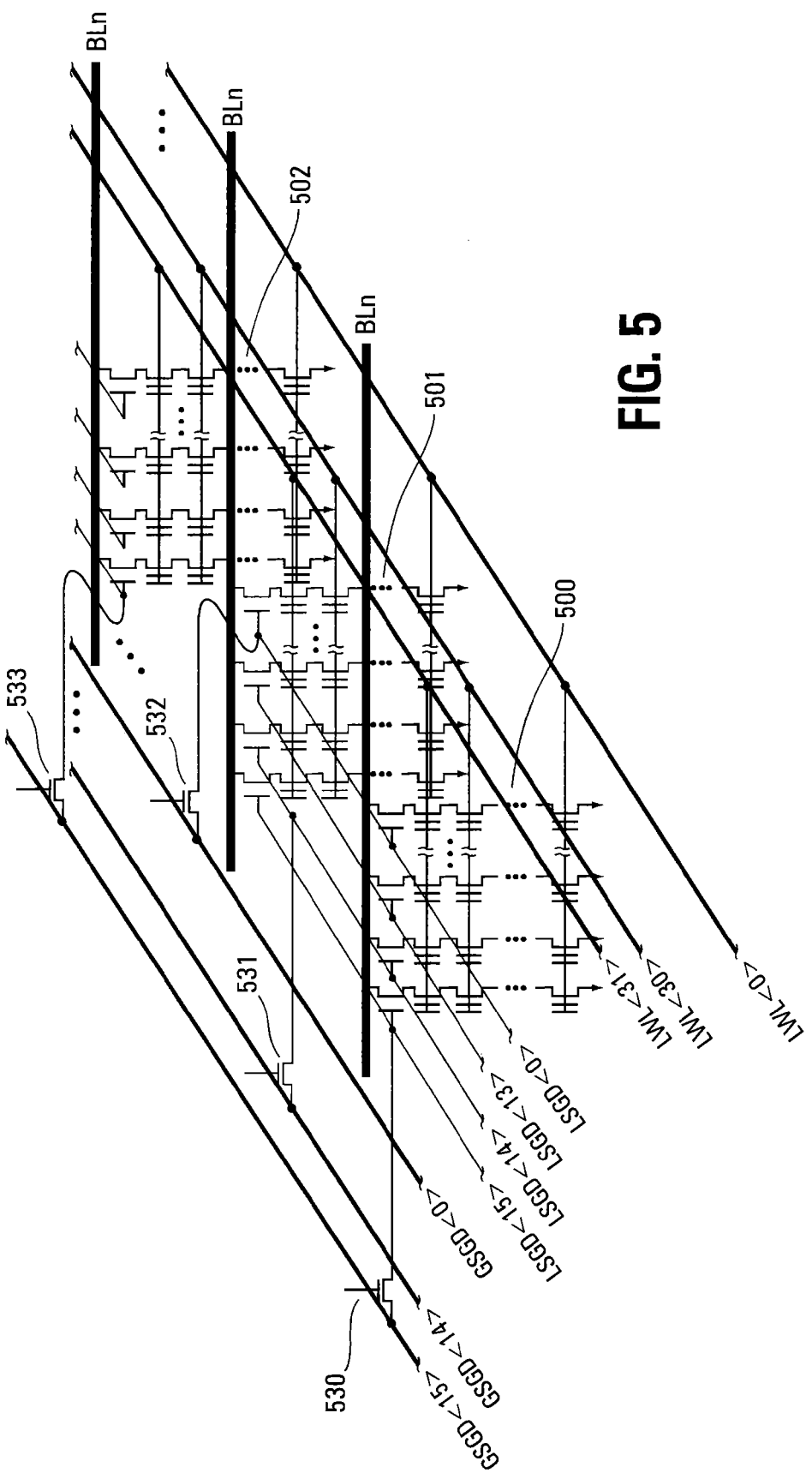
FIG. 5 shows a schematic diagram of an alternate embodiment of an architecture in which local select gate drain lines are shared across multiple planes.

FIG. 5 illustrates a schematic diagram of an alternate embodiment of an architecture for sharing local select gate drain lines across multiple planes. The architecture of the embodiment of FIG. 5 is substantially similar to that of FIG. 4 except that the embodiment of FIG. 5 only shares local SGD lines between a subset of the planes of a block as opposed to across all of the planes of the block.

The embodiment of FIG. 5 shows three vertical planes 500-502 of a memory block. The first two vertical planes 500, 501 share one set of local SGD lines LSGD<15:0>. The third vertical plane 502 could share another set of local SGD lines with its adjacent vertical plane (not shown).

For example, a sixteenth global SGD line GSGD<15> of the sixteenth and fifteenth planes 500, 501 is coupled to the local SGD line LSGD<15> through select gate 530. The fifteenth global SGD line GSGD<14> of the sixteenth and fifteenth planes 500, 501 is coupled to the local SGD line LSGD<14> through select gate 531. The first gobal SGD line GSGD<0> of the sixteenth and fifteenth planes 500, 501 is coupled to the local SGD line LSGD<0> through select gate 532. LSGD<15:0> for the sixteenth and fifteenth planes are shared only by those two planes 500, 501 in the illustrated embodiment.

Similarly, the sixteenth global SGD line GSGD<15> of the first 502 and second planes (not shown) is coupled to the local SGD line LSGD<15> through select gate 533. LSGD<15:0> for the first and second planes are shared only by those two planes in the illustrated embodiment.

While the embodiment of FIG. 5 illustrates the local SGD lines being shared between two vertical planes, alternate embodiments can share local SGD lines between any number of vertical planes within the memory block. There is also no requirement that the vertical planes that share the local SGD lines be adjacent to one another.

Figure 6:
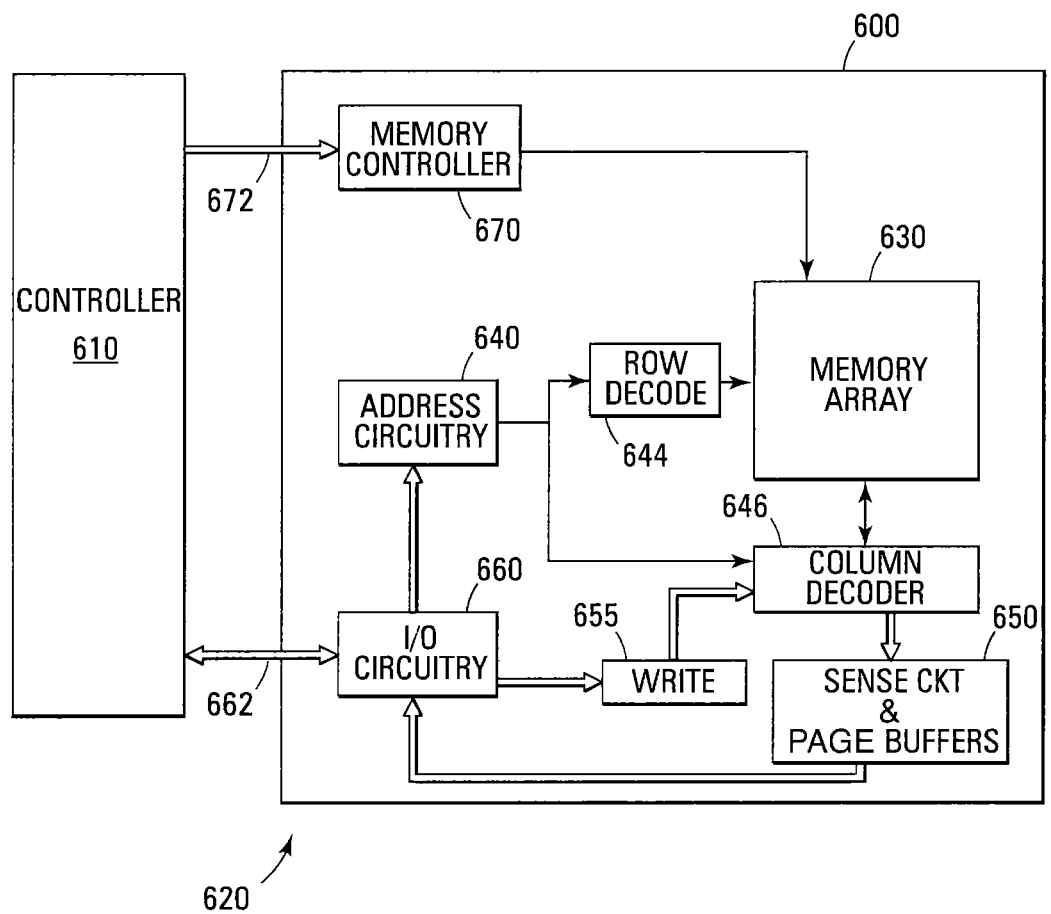
FIG. 6 shows a block diagram of one embodiment of a memory system that can incorporate a memory array having an architecture in which local select gate drain lines are shared across multiple planes.

FIG. 6 illustrates a functional block diagram of a memory device 600. The memory device 600 is coupled to an external controller 610. The controller 610 may be a microprocessor or some other type of processor. The memory device 600 and the external controller 610 form part of a memory system 620. The memory device 600 has been simplified to focus on features of the memory that are helpful in understanding the present embodiments.

The memory device 600 includes an array 630 of non-volatile memory cells. The memory array 630 is arranged in banks of word line rows and bit line columns. In one embodiment, the columns of the memory array 630 comprise series strings of memory cells. As is well known in the art, the connections of the cells to the bit lines determines whether the array is a NAND architecture, an AND architecture, or a NOR architecture.

Address buffer circuitry 640 is provided to latch address signals provided through I/O circuitry 660. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased plane and block counts.

The memory device 600 senses data in the memory array 630 by sensing voltage or current changes in the memory array columns using sense amplifier circuitry 650. The sense amplifier circuitry 650, in one embodiment, is coupled to sense and latch a row of data from the memory array 630. I/O circuitry 660 is included for bidirectional data communication as well as the address communication over a plurality of data connections 662 with the controller 610. Write circuitry 655 is provided to write data to the memory array.

Memory controller 670 decodes signals provided on control connections 672 from the external controller 610. These signals are used to control the operations on the memory array 630, including data read, data write (program), and erase operations. The memory controller 670 may be a state machine, a sequencer, or some other type of controller to generate the memory control signals. The memory controller 670, address circuitry 640, row decoder 644, column decoder 650, I/O circuitry 650, write circuitry 655, and sense circuitry/page buffers 646 can all be considered to be memory control circuitry.

In one embodiment, the memory control circuitry is configured to control activation of the select gates as described previously. The memory control circuitry is also configured to control access to a selected vertical plane, series string of memory cells, and/or individual memory cells by appropriate addressing and control of the word lines.

The flash memory device illustrated in FIG. 6 has been simplified to facilitate a basic understanding of the features of the memory. A more detailed understanding of internal circuitry and functions of flash memories are known to those skilled in the art.

Conclusion

In summary, one or more embodiments of the present disclosure enable sharing local control lines across multiple planes. In some embodiments, for each global select gate drain line, only a single pass gate is used to couple the respective global select gate drain line to a local select gate drain line that is shared across the planes of a block of memory.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A memory device comprising:
   a plurality of planes of memory cells, each plane having at least one series string of memory cells, each series string of memory cells having a local select gate wherein a control gate of each corresponding local select gate of the plurality of planes of memory cells is coupled to a local shared control line and only one global select gate is configured to control access for the local shared control line to a global control line.

2. The memory device of claim 1 wherein the local shared control line is a local select gate line and the global control line is a global select gate line.

3. The memory device of claim 1 wherein each plane comprises a plurality of series strings of memory cells.

4. The memory device of claim 1 wherein the plurality of planes of memory cells comprise a block of memory cells.

5. The memory device of claim 4 wherein each local select gate is a select gate drain transistor that couples its respective series string of memory cells to a data line.

6. The memory device of claim 5 wherein the data line is common only to the series strings in the block of memory cells.

7. The memory device of claim 1,
   wherein the plurality of planes of memory cells comprises a first plane of memory cells that comprises a plurality of memory cells commonly coupled to a first access line and a second plane of memory cells that comprises a plurality of memory cells commonly coupled to a second access line different than the first access line, the first and second access lines commonly coupled to a same local access line; and
   wherein the plurality of memory cells commonly coupled to the first access line comprises a memory cell from the at least one series string of memory cells of the first plane of memory cells and the plurality of memory cells commonly coupled to the second access line comprises a memory cell from the at least one series string of memory cells of the second plane of memory cells.

8. A memory device comprising:
   a first vertical plane of memory cells, wherein the first vertical plane of memory cells comprises a first vertical string of memory cells coupled to a first select gate; and
   a second vertical plane of memory cells, wherein the second vertical plane of memory cells comprises a second vertical string of memory cells coupled to a second select gate;
   wherein the first and second select gates are coupled to a shared local control line and only one global select gate couples the shared local control line to a global control line;
   wherein the first vertical string of memory cells is one of a plurality of first vertical strings of memory cells of the first vertical plane of memory cells and the second vertical string of memory cells is one of a plurality of second vertical strings of memory cells of the second vertical plane of memory cells;

wherein a plurality of memory cells of the first vertical plane of memory cells are commonly coupled to a same first access line, the plurality of memory cells of the first vertical plane of memory cells commonly coupled to the same first access line comprising a memory cell from each of the plurality of first vertical strings of memory cells of the first vertical plane of memory cells; and wherein a plurality of memory cells of the second vertical plane of memory cells are commonly coupled to a same second access line, the plurality of memory cells of the second vertical plane of memory cells commonly coupled to the same second single access line comprising a memory cell from each of the plurality of second vertical strings of memory cells of the second vertical plane of memory cells.

9. The memory device of claim 8 and further comprising:
a third vertical plane of memory cells, wherein the third vertical plane of memory cells comprises a third vertical string of memory cells coupled to a third select gate,
wherein the third select gate is coupled to the local shared control line and the third vertical plane does not include a global select gate that couples the third select gate to the global control line.

10. The memory device of claim 8 wherein the first same access line and the second same access line are commonly coupled to a same local access line.

11. The memory device of claim 8 wherein the first and second vertical planes of memory cells are part of an array of memory cells that comprises one of a NAND architecture, a NOR architecture, or an AND architecture.

12. The memory device of claim 8 and further comprising:
a third vertical plane of memory cells, wherein the third vertical plane of memory cells comprises a third vertical string of memory cells coupled to a third select gate,
wherein the third select gate is not coupled to the shared local control line.

13. A method for accessing a selected memory cell comprising:
activating a global select gate to couple a global control line to an associated local control line that is shared by a plurality of local select gates across a plurality of planes of memory cells, wherein the selected memory cell is in one of the plurality of planes; and
biasing an access line coupled to a control gate of the selected memory cell;
wherein the plurality of planes of memory cells comprises a first plane of memory cells that comprises a plurality of memory cells commonly coupled to a first access line and a second plane of memory cells that comprises a plurality of memory cells commonly coupled to a second access line different than the first access line, the first and second access lines commonly coupled to a same local access line.

14. The method of claim 13 wherein activating the select gate activates each of the local select gates that share the associated local control line.

15. The method of claim 13 and further comprising biasing a data line coupled to the memory cell through one of the plurality of local select gates that share the local control line.

16. The method of claim 15 wherein the data line is biased with a voltage appropriate to an operation performed on the selected memory cell.

17. A system comprising:
a controller configured to control the memory system; and
a memory device coupled to the controller the memory device comprising:
a plurality of vertical planes of memory cells, each plane having at least one series string of memory cells, each series string of memory cells having a local select gate wherein a control gate of each corresponding local select gate of the plurality of planes of memory cells is coupled to a local shared control line and only one global select gate is configured to control access for the local shared control line to a global control line;
wherein the plurality of vertical planes of memory cells comprises a first vertical plane of memory cells that comprises a plurality of memory cells commonly coupled to a first access line and a second vertical plane of memory cells that comprises a plurality of memory cells commonly coupled to a second access line different than the first access line, the first and second access lines commonly coupled to a same local access line; and
wherein the plurality of memory cells commonly coupled to the first access line comprises a memory cell from the at least one series string of memory cells of the first vertical plane of memory cells and the plurality of memory cells commonly coupled to the second access line comprises a memory cell from the at least one series string of memory cells of the second vertical plane of memory cells.

18. The system of claim 17 wherein the memory device further comprises control circuitry configured to activate the global select gate that is coupled between the local shared control line and the global control line.

19. The system of claim 17 wherein the local shared control line is coupled only to control gates of select gates of a subset of the plurality of vertical planes of memory cells that is less than the plurality of vertical planes.

20. The system of claim 19 wherein the subset of the plurality of vertical planes comprise adjacent planes.

21. A system comprising:
a controller configured to control the system; and
a memory device coupled to the controller the memory device comprising:
a first vertical plane of memory cells, wherein the first vertical plane of memory cells comprises a first vertical string of memory cells coupled to a first select gate; and
a second vertical plane of memory cells, wherein the second vertical plane of memory cells comprises a second vertical string of memory cells coupled to a second select gate;
wherein the first and second select gates are coupled to a first shared local control line and only a first global select gate couples the first shared local control line to a first global control line;
wherein the first vertical string of memory cells is one of a plurality of first vertical strings of memory cells of the first vertical plane of memory cells and the second vertical string of memory cells is one of a plurality of second vertical strings of memory cells of the second vertical plane of memory cells;
wherein a plurality of memory cells of the first vertical plane of memory cells are commonly coupled to a same first access line, the plurality of memory cells of the first vertical plane of memory cells commonly coupled to the same first access line comprising a memory cell from each of the plurality of first vertical strings of memory cells of the first vertical plane of memory cells;

wherein a plurality of memory cells of the second vertical plane of memory cells are commonly coupled to a same second access line, the plurality of memory cells of the second vertical plane of memory cells commonly coupled to the same second single access line comprising a memory cell from each of the plurality of second vertical strings of memory cells of the second vertical plane of memory cells; and wherein the first and second same single access lines are commonly coupled to a same local access line.

22. The system of claim 21 and further comprising:
a third vertical plane of memory cells, wherein the third vertical plane of memory cells comprises a third vertical string of memory cells coupled to a third select gate; and
a fourth vertical plane of memory cells, wherein the fourth vertical plane of memory cells comprises a fourth vertical string of memory cells coupled to a fourth select gate,
wherein the third and fourth select gates are coupled to a second shared local control line and only a second global select gate couples the second shared local control line to a second global control line.

23. The system of claim 22 wherein the memory device further comprises memory control circuitry configured to control access to a selected memory cell of a select series string by controlling activation of one of the first or the second global select gates.

24. The system of claim 23 wherein the control circuitry is further configured to control a bias of a select line coupled to a control gate of the selected memory cell in order to access the selected memory cell.

25. The system of claim 23 wherein the memory control circuitry comprises a memory controller, address circuitry, a row decoder, a column decoder, I/O circuitry, write circuitry, and sense circuitry/page buffers.

26. The system of claim 22 wherein the first and second select gates are corresponding select gates.

27. The system of claim 26 wherein the third and fourth select gates are not corresponding select gates to the first and second select gates.

28. A memory device comprising:
a plurality of vertical planes of memory cells, each plane having a plurality of vertical strings of memory cells, each vertical string coupled to a respective local select gate, control gates of each of the corresponding local select gates of each plane coupled to a corresponding local control line wherein each corresponding local control line is coupled to a corresponding global control line only through one corresponding global select gate,
wherein the plurality of vertical planes of memory cells comprises a first vertical plane of memory m rises a plurality of memo cells commonly coupled to a first access line and a second vertical plane of memory cells that comprises a plurality of memory cells commonly coupled to a second access line different than the first access line, the first and second access lines commonly coupled to a same local access line; and
wherein the plurality of memory cells commonly coupled to the first access line comprises a memory cell from each of plurality of vertical strings of memory cells of the first vertical plane of memory cells and the plurality of memory cells commonly coupled to the second access line comprises a memory cell from each of plurality of vertical strings of memory cells of the second vertical plane of memory cells.

29. The memory device of claim 28 wherein the local select gates are select gate drain transistors.

30. The memory device of claim 29 wherein local select gates selectively couple their respective vertical string to a data line.

31. The memory device of claim 30 wherein the data line is a common bit line to a block of memory cells.

* * * * *

UNITED STATES PATENT AND TRADEMARK OFFICE
CERTIFICATE OF CORRECTION

PATENT NO.         : 8,947,934 B2
APPLICATION NO.    : 13/339721
DATED              : February 3, 2015
INVENTOR(S)        : Aaron Yip Page 1 of 1

It is certified that error appears in the above-identified patent and that said Letters Patent is hereby corrected as shown below:

In the Claims

In column 10, line 12, in Claim 28, delete "gate," and insert -- gate; --, therefor.

In column 10, line 14, in Claim 28, delete "m rises" and insert -- cells that comprises --, therefor.

In column 10, line 15, in Claim 28, delete "memo" and insert -- memory --, therefor.

Signed and Sealed this
Fifth Day of May, 2015

Michelle K. Lee
*Director of the United States Patent and Trademark Office*